(12) United States Patent
Blümel (10) Patent No.: US 7,465,074 B2
(45) Date of Patent: Dec. 16, 2008

(54) OPTICAL ELEMENT

(75) Inventor: Simon Blümel, Schierling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 205 days.

(21) Appl. No.: 11/181,388

(22) Filed: Jul. 14, 2005

(65) Prior Publication Data

US 2006/0018010 A1 Jan. 26, 2006

(30) Foreign Application Priority Data

Jul. 20, 2004 (DE) .................. 10 2004 035 127
Sep. 2, 2004 (DE) .................. 10 2004 042 561

(51) Int. Cl.
*F21V 5/04* (2006.01)

(52) U.S. Cl. .................. 362/335; 362/340; 362/334

(58) Field of Classification Search ......... 362/335–338, 362/326–329, 340, 20, 332, 360, 361, 16, 362/309, 244; 359/709–712, 642, 853
See application file for complete search history.

(56) References Cited

U.S. PATENT DOCUMENTS

| 2,224,178 | A | * | 12/1940 | Bitner | 362/337 |
| 4,264,948 | A | * | 4/1981 | Cherouge | 362/335 |
| 4,734,836 | A | * | 3/1988 | Negishi | 362/311 |
| 4,907,044 | A | | 3/1990 | Schellhorn et al. | 257/98 |
| 5,485,317 | A | * | 1/1996 | Perissinotto et al. | 359/712 |
| 5,526,190 | A | * | 6/1996 | Hubble et al. | 359/710 |
| 5,757,557 | A | * | 5/1998 | Medvedev et al. | 359/711 |
| 6,478,453 | B2 | * | 11/2002 | Lammers et al. | 362/294 |
| 6,568,822 | B2 | | 5/2003 | Boyd et al. | 362/621 |
| 6,647,199 | B1 | | 11/2003 | Pelka et al. | 383/146 |
| 6,741,324 | B1 | | 5/2004 | Kim | 362/249 |
| 2001/0007527 | A1 | | 7/2001 | Lammers et al. | 362/294 |
| 2002/0080615 | A1 | | 6/2002 | Marshall et al. | 362/333 |
| 2003/0161137 | A1 | | 8/2003 | Schach et al. | 362/29 |
| 2003/0202241 | A1 | | 10/2003 | Blumel | 359/365 |
| 2004/0062055 | A1 | | 4/2004 | Rozenberg et al. | 362/555 |
| 2004/0170018 | A1 | * | 9/2004 | Nawashiro | 362/244 |
| 2004/0264185 | A1 | * | 12/2004 | Grotsch et al. | 362/231 |

FOREIGN PATENT DOCUMENTS

| DE | 100 51 464 | 5/2002 |
| DE | 102 58 193 | 7/2004 |
| EP | 0 987 577 | 3/2000 |
| JP | 2004193623 | 7/2004 |
| WO | 98/12757 | 3/1998 |

OTHER PUBLICATIONS

Arbeitsstättenverordnung, § 7, Abschnitt (4), 1975.
Dattenblatt Luminaire dimensions: "emLED-s (stand alone unit)", Copyright 2000-2004 Fagerhults Belysning AB.

(Continued)

*Primary Examiner*—Bao Q Truong
(74) *Attorney, Agent, or Firm*—Fish & Richardson P.C.

(57) ABSTRACT

An optical element is specified that comprises a radiation exit surface shaped so that light exiting through said radiation exit surface is suitable for substantially uniformly illuminating a defined area from a defined distance. The optical element is particularly well suited for use in emergency lighting systems.

19 Claims, 5 Drawing Sheets

OTHER PUBLICATIONS

Dattenblatt Emergency unit F: "emLED-s (stand alone unit)", p. 1, www.fagerhult.com, May 3, 2004.

Licht, Planung Design Technik Haldel "light + building", Mar. 2004, März 2004, 56. Jahrgang, ISSN 0024/2861, Pflaum Verlag GmbH & Co. KG. pp. 172-174, 176, 178-181, 260.

I. Schnitzer et al., „30% external quantum efficiency from surface textured, thin-film light-emitting diodes, *Applied Physics Letters*, 63(16), 18. Oct. 1993, pp. 2174-2176.

European Search Report dated Sep. 21, 2005.

* cited by examiner

OPTICAL ELEMENT

PRIORITY INFORMATION

Pursuant to 35 U.S.C. §119(a), this application claims priority to the following German Patent Applications DE 102004035127.9 filed Jul. 20, 2004 and DE 102004042561.2 filed Sep. 2, 2004, the contents of which are incorporated herein by reference.

BACKGROUND

This applications relates an optical element, such as those used with light-emitting diodes (LEDs). For example, the document U.S. Pat. No. 6,741,324 B1 describes an escape-route and emergency lighting system comprising two lights. Each light can comprise a light-emitting diode (LED) with a lens disposed thereafter.

SUMMARY

Optical elements are disclosed by means of which a defined area can be illuminated uniformly and efficiently.

In one aspect, an optical element is disclosed that includes a body and a radiation exit surface shaped so that light exiting the body of the optical element through the radiation exit surface is suitable for substantially uniformly illuminating a defined area from a defined distance. A light source, for example, an LED, is typically positioned at or near a radiation entrance surface of the optical element to provide the light to the optical element. In certain embodiments, the radiation exit surface is shaped based on the assumption that the light source provides the light with Lanbertian emission characteristics.

The shape of the radiation exit surface permits a substantially uniform distribution of the light on the area to be illuminated. "Substantially uniform illumination of the area" means in this context that the illuminance, measured on the illuminated surface, is substantially constant. That is, the illuminance at the brightest location in the defined area is no more than 50% greater than at the darkest location in the area. In preferred embodiments, the illuminance at the brightest location in the defined area is no more than 25% greater, particularly preferably no more than 10% greater, than at the darkest location in the area.

At the edge of the defined area the illuminance preferably drops off sharply and thus exhibits steep flanks there. Hence, chiefly the defined area is preferably illuminated.

The radiation characteristic of a radiation-emitting element whose radiation is coupled into the optical element is preferably not reproduced by the optical element in the surface area to be illuminated. That is, the optical element is preferably a non-imaging optic.

To summarize, therefore, an optical element is specified that comprises a radiation-exit surface shaped so that light exiting the body of the optical element through the radiation exit surface is suitable for substantially uniformly illuminating a defined area from a defined distance.

In one embodiment of the optical element, the optical element includes a radiation entrance surface and a radiation exit surface. The radiation exit surface is preferably disposed on the opposite side of the optical element from the radiation entrance surface. That is, electromagnetic radiation coupled into the optical element, for example perpendicularly to the radiation entrance surface, preferably exits the optical element through the radiation exit surface.

In one embodiment of the optical element, the radiation exit surface of the optical element comprises at least one concavely and at least one convexly curved subregion. "Concavely curved" here means that the radiation exit surface of the optical element is curved inwardly in the concavely curved subregion, while "convexly" means that the radiation exit surface is curved outwardly in the convex subregion. Owing to the curvature of the radiation exit surface, light exiting through the radiation exit surface is preferably refracted in such fashion as to attain the most uniform possible distribution of the illuminance on the area to be illuminated.

In a further embodiment of the optical element, a concavely curved subregion of the radiation exit surface is disposed at the center of the radiation exit surface. That is, for example, the radiation exit surface is shaped so that it has a geometric center point. The concavely curved subregion is then preferably disposed so that it contains the center point of the radiation exit surface. Particularly preferably, the concavely curved subregion is disposed so that the geometric center point of the radiation exit surface and the local minimum of the concavely curved region coincide.

In one embodiment of the optical element, the concavely curved subregion is disposed adjacent at least one convexly curved subregion. That is, if one moves across the radiation exit surface beginning from a concavely curved subregion, in at least one spatial direction the concavely curved subregion will be followed by a convexly curved subregion. Particularly preferably, the concavely curved subregion is surrounded by at least two convexly curved subregions. That is, if one moves across the radiation exit surface starting from a concavely curved subregion, in each of at least two spatial directions a convexly curved subregion follows.

In a further embodiment of the optical element, a plan view of the radiation exit surface substantially matches the shape of the area to be illuminated. That is, the shape of the radiation exit surface projected into a plane can be adapted to the shape of the area to be illuminated. Said plane can, for example, be the plane of the defined area. The plane preferably also extends parallel to the radiation exit surface.

The area to be uniformly illuminated and the planar surface defined by the edge of the radiation exit surface are preferably geometrically similar to each other. If the area to be illuminated is, for example, rectangular in shape, then the planar surface of the optical element defined by the edge of the radiation exit surface is also rectangular. In addition, this surface then has the same height to width ratio as the area to be illuminated. The actual size of the surface area bounded by the edge of the radiation exit surface is then additionally defined, for example, by the distance from the area to be illuminated.

In a further embodiment of the optical element, the optical element comprises at least one surface that is disposed between the radiation entrance surface and the radiation exit surface and is reflectively implemented. That is, radiation coupled into the optical element through the radiation entrance surface can, as it passes through the optical element, be reflected from this surface. This prevents light from exiting through this surface. The reflecting surface therefore helps to ensure that the defined area, above all, is illuminated as uniformly as possible. The illuminance can be sharply reduced in adjacent regions. The efficiency of the optical element is therefore increased, since the available light is used substantially to illuminate the defined area.

The surface is reflectively coated, for example, or reflection from the surface occurs as a result of total reflection. The surface is preferably a side face of the optical element. For example, all the side faces of the optical element, i.e., all the surfaces disposed between the radiation entrance surface and the radiation exit surface of the optical element, are reflectively implemented.

In a further embodiment of the optical element, at least one additional radiation exit surface is disposed between the radiation entrance surface and the radiation exit surface. This radiation exit surface can, for example, be arranged so that edge regions of the defined area are better illuminated, so as to achieve more uniform illumination of said area. This radiation exit surface preferably has no concavely or convexly curved subregions, but instead is either uniformly curved or extends substantially rectilinearly. The surface is, for example, a side face of the optical element that joins the radiation exit surface and the radiation entrance surface of the optical element to each other.

In a further embodiment of the optical element, the optical element is formed of a transparent material. The material preferably has a refractive index that is greater than the refractive index of the material bordering the first exit surface. That is, light rays that leave the optical element for example through the first radiation exit surface pass from the optically denser into the optically thinner medium and are refracted at the radiation exit surface according to the laws of geometric optics. The curvature of the radiation exit surface and the refractive index of the optical element are preferably adapted to each other so that substantially uniform illumination of the defined area is provided. To this end, the optical element preferably contains a material that has a refractive index greater than n=1.3. Particularly preferably, the optical element contains one of the following materials: Plexiglas, glass, polycarbonate. However, other transparent materials, such as synthetic materials, for example, can also be contemplated for the optical element.

Further specified is an LED arrangement comprising one of the above-described optical elements and at least one LED.

Said LED is preferably so arranged that the radiation entrance surface of the optical element is disposed after the LED in a main radiation direction of the LED. That is, a predominant portion of the light emitted by the LED is coupled into the optical element through the radiation entrance surface. To this end, a gap, for example containing air, can be disposed between the LED and the optical element. It is also, however, possible for the optical element to be adhesively bonded to a potting material that for example surrounds the LED chip.

The LED is preferably a surface-mountable LED. With an LED of this kind, the optical element can be disposed particularly close to the LED chip, so that an especially large portion of the electromagnetic radiation emitted by the LED is coupled into the optical element through the radiation entrance surface.

In one embodiment of the LED arrangement, the LED is disposed opposite a concavely curved subregion of the radiation exit surface. The LED is preferably arranged so that it is centered with respect to the concavely curved subregion of the radiation exit surface of the optical element. In this way, electromagnetic radiation coupled from the LED through the radiation entrance surface into the optical element can be distributed especially uniformly over the defined area. The radiation is, for example, refracted by the concavely curved subregion to the adjacent regions of the radiation exit surface lateral to the concavely curved subregion. The result achieved is that no distinct maximum, for example caused by a nearly punctiform light source, can be perceived on the defined area.

In one embodiment of the LED arrangement, the LED chip of the LED comprises a radiation decoupling surface disposed opposite the radiation entrance surface of the optical element. The bulk of the electromagnetic radiation generated in the LED chip preferably exits through the radiation decoupling surface of the LED chip. Particularly preferably, the radiation exits exclusively through the radiation decoupling surface. In this way, as little radiation as possible is radiated laterally, and thus lost to illumination of the defined area, before entering the optical element.

The LED chip preferably contains an epitaxially grown layer stack. The layer stack is, for example, a sequence of epitaxially grown layers. The layer stack preferably includes at least one active zone suitable for generating electromagnetic radiation. The active zone is preferably suitable for generating electromagnetic radiation in the blue or ultraviolet region of the spectrum.

To this end, the active zone can, for example, comprise a pn junction, a double heterostructure, a single quantum well structure, or, particularly preferably, a multi-quantum-well structure (MQW).

The term "quantum well structure" in the context of the application encompasses any structure in which charge carriers undergo quantization of their energy states by confinement. Specifically, the term "quantum well structure" carries no implication as to the dimensionality of the quantization. It therefore includes, among other things, quantum wells, quantum wires and quantum dots and any combination of these structures.

The layer stack is particularly preferably a sequence of epitaxially grown layers from which the growth substrate was removed on completion of the epitaxial growth. Particularly preferably, a support is applied to the surface of the layer stack facing away from the original growth substrate. Components whose production involves removing the growth substrate from an epitaxially grown layer sequence are often also referred to by the generic term "thin-film components."

A basic principle of a thin-film component is described, for example, in I. Schnitzer et al., *Appl. Phys. Lett.* 63(16), Oct. 18, 1993, pages 2174-2176, whose disclosure content as to the basic principle of thin-film components is hereby incorporated by reference.

A thin-film LED is, as a good approximation, a Lambertian surface radiator, and is therefore particularly well suited for use in a searchlight or headlight, for example. A Lambertian surface radiator is one whose illumination flux varies with the cosine of the angle of emission from a normal to the surface radiator.

It is particularly advantageous that the support can be relatively freely selected, compared to the growth substrate. The support can thus be better suited to the component with regard to a number of properties, such as conductivity, stability or the thermal expansion coefficient, than available growth substrates, which are subject to tight constraints in the production of high-quality, epitaxially grown layer sequences. For instance, to obtain high-quality epitaxial layers, the epitaxially deposited material must for example be lattice-matched to the growth substrate.

According to a preferred refinement of the LED chip, a mirror layer is disposed between the applied support and the layer stack. The layer stack can, for example, include a Bragg mirror or a metal-containing mirror layer. A metal-containing mirror, which can for example contain gold, gold/germanium, silver, aluminum or platinum, is distinguished from a Bragg mirror by, for example, a reflectivity that is less directionally dependent. In addition, higher reflectivity can be obtained with metal-containing mirrors than with Bragg mirrors.

Preferably disposed after the LED chip is a conversion material that is suitable for converting at least a portion of the electromagnetic radiation generated in the LED chip into electromagnetic radiation of a greater wavelength. In this way, it is, for example, possible for blue light generated by the LED chip to be mixed with wavelength-converted yellow light to yield white light. Suitable luminescence conversion materials are described for example in the document WO98/12757, whose content in this regard is hereby incorporated by reference. The conversion material can, for example, be present in the potting compound surrounding the LED chip. The conversion material can also be present in the optical element, however.

In a further embodiment of the LED arrangement, the LED has an electric power consumption of between 1 and 2 W. The optical efficiency of the LED in this case is between 15 and 25 lm/W. Particularly preferably, the efficiency of the LED is more than 25 lm/W.

In a further embodiment of the LED arrangement, the LED arrangement is suitable for illuminating a surface area of at least 16 $m^2$ with an average illuminance of at least 1 lx. Particularly preferably, the surface area is illuminated with a substantially homogeneous illuminance of at least 1 lx. Note that "lx" is the abbreviation for Lux, which is the International Standard (SI) unit of measure for luminous flux density at a surface. One Lux equals one lumen (lm) per square meter.

Further specified is emergency lighting comprising one of the above-described LED arrangements and a network-independent power supply. Said network-independent power supply can be, for example, commercial rechargeable batteries, disposed along with the LED arrangement in a housing, for example. It is also possible, however, for the LED arrangement to be connected via the in-house power supply system and to be powered via emergency power generating sets in the event of a power failure.

The use of LEDs for such emergency lighting systems advantageously makes for lights with a high service life. Using optimized optics as described makes it possible to sharply reduce the number of necessary light sources while still meeting the minimum illuminance requirement stipulated, for example, in the Workplace Ordinance [Arbeitsstättenverordnung], Para. 7, Sec. (4), according to which emergency lighting must have an illuminance of at least 1 lx. Making optimum use of the available light from the lamps by virtue of the optimized optics makes it possible to design lamps with very low power consumption. Very small, decentralized storage batteries can thus be used.

The here-described optical element and the here-described LED arrangement are explained in more detail below with reference to exemplary embodiments and the accompanying figures.

BRIEF DESCRIPTION OF THE DRAWINGS

FIG. 5A shows a cross-sectional view of the optical element at the reflective surface 2a.

In the exemplary embodiments and figures, similar or similarly acting components are provided with the same respective reference numerals. The illustrated components and the size ratios of the components to one another should not be considered true to scale. Rather, some details of the figures have been depicted as over-large to furnish a better understanding.

DETAILED DESCRIPTION

Figure 1:
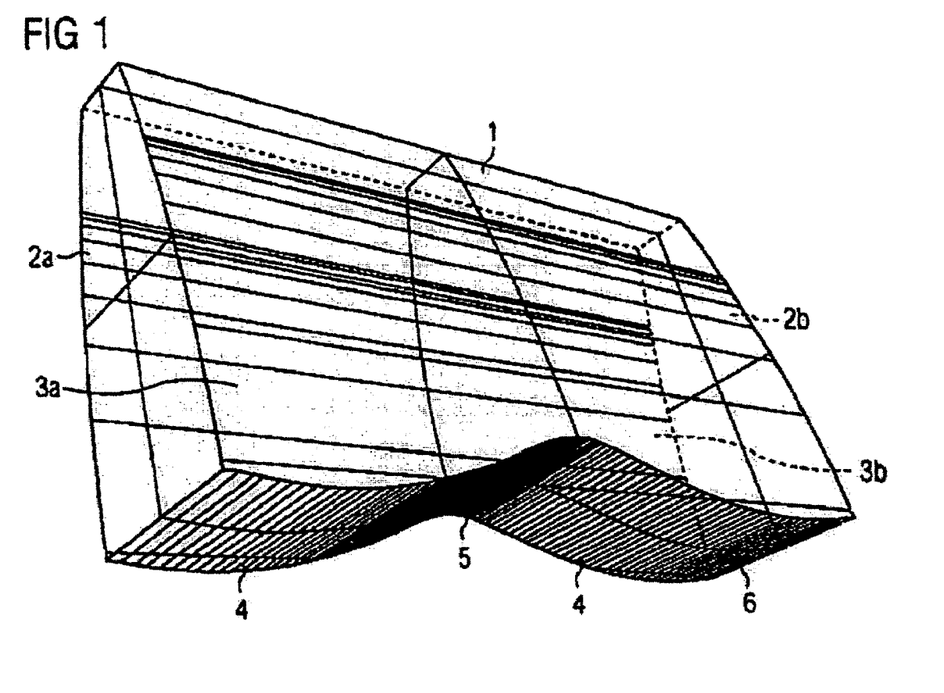
FIG. 1 is a perspective schematic diagram of one exemplary embodiment of the here-described optical element.

FIG. 1 is a perspective schematic diagram of the here-described optical element. The optical element comprises a radiation entrance surface 1 through which electromagnetic radiation can be coupled into the optical element. The radiation entrance surface is constituted, for example, by a rectangular surface about 4 cm long and about 0.25 cm wide.

Laterally disposed on the optical element are, for example, reflective surfaces 2a, b. The reflection of the radiation passing through the optical element can occur, for example, by total reflection from reflective surfaces 2a, 2b. However, it is also possible for reflective surfaces 2a, b to be formed by coating the side faces, for example with a metal. For example, the side faces can be coated for this purpose with silver.

Radiation can exit the optical element through the lateral radiation exit surfaces 3a, b extending perpendicularly to reflective surfaces 2a, 2b, to the extent that the condition for total reflection is not met with respect to the radiation. In this case, the exiting light contributes above all to the illumination of the edge regions of the defined area. That is, side faces 3a, 3b are also implemented as reflective. There, the reflection of electromagnetic radiation preferably takes place by total reflection. Overly divergent radiation that does not meet the condition for total reflection exits through side faces 3a, 3b.

However, the bulk of the radiation entering the optical element through radiation entrance surface 1 is decoupled from the optical element through radiation exit surface 6. This radiation exit surface is, for example, 4 cm long and 1 cm wide.

In this case, radiation exit surface 6 comprises, for example, a concavely curved subregion 5 in the center of radiation exit surface 6 and two convexly curved subregions 4 that laterally enclose concavely curved subregion 5. Concavely curved subregion 5 is, for example, disposed at the geometric center of radiation exit surface 6.

The optical element is formed, for example, of polycarbonate, glass or Plexiglas. It is preferably produced by injection molding or transfer molding. Particularly low-cost production of the optical element is possible in this way. Other potential materials of which the optical element can be composed are polymethyl methacrylate (PMMA), poly(monomethyl itconate) (PMMI) and/or cyclo olefin copolymer (COC).

Figure 2:
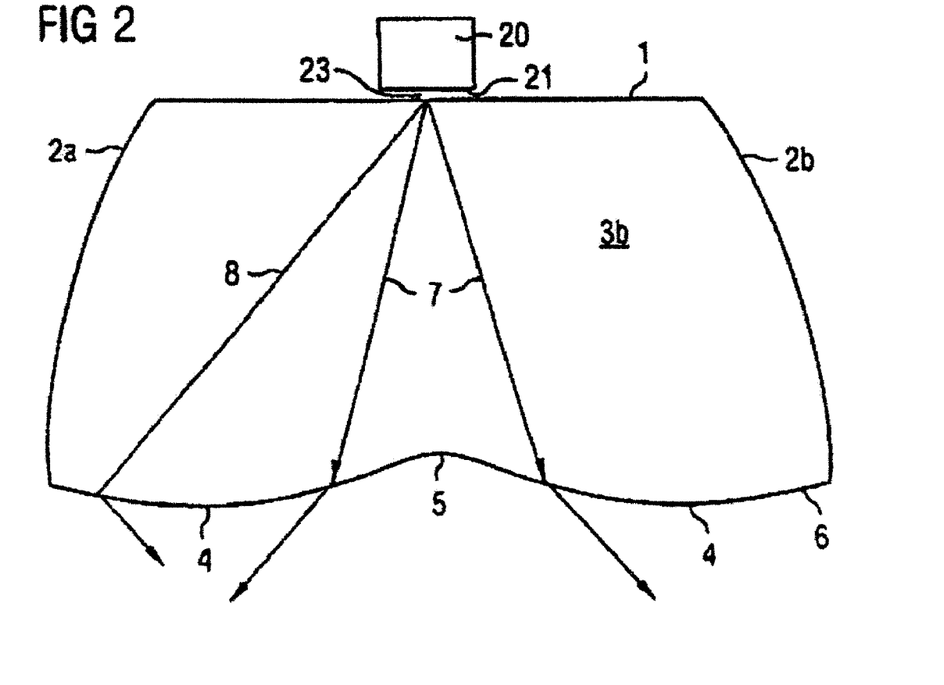
FIG. 2 is a schematic sectional diagram of the here-described optical arrangement.

FIG. 2 is a schematic sectional diagram of an LED arrangement comprising an optical element as described for example in FIG. 1. An LED 20 is disposed with its radiation decoupling surface 21 facing the radiation entrance surface 1 of the optical element. LED 20 is preferably arranged so as to be centered with respect to concavely curved region 5. The LED preferably has a power consumption of about 1.5 W and an efficiency of about 21 mW.

Between radiation entrance surface 1 and radiation exit surface 21 of LED 20 there is a gap 23, filled, for example, with air.

The first arrows 7 sketchily illustrate the optical path of radiation emanating from the region of radiation entrance surface 1 opposite the radiation decoupling surface 21 of LED 20 and striking the concavely curved subregion 5 of radiation exit surface 6. Here, the radiation is refracted from the center of radiation exit surface 6 to the edge regions. The radiation is thereby redistributed from the region of radiation exit surface 6 opposite LED 20 to the sideward regions. The radiation generated by LED 20 can be distributed uniformly in this way.

Radiation striking the convexly curved subregions 4 of radiation exit surface 6 is refracted to the center of radiation exit surface 6 (see arrow 8, for example). This makes for, among other things, a sharp drop in illuminance at the edge of the area to be illuminated.

Side faces 3a, 3b of the optical element can, for example, be shaped at least locally in the manner of one of the following optical elements: a compound parabolic concentrator (CPC), a compound elliptic concentrator (CEC), a compound hyperbolic concentrator (CHC). Further, side faces 3a, 3b can be free-form surfaces or can be constituted at least locally by a planar surface. Optical element 1 preferably tapers in the direction of light source 20 in a section perpendicular to the section shown in FIG. 2.

Figure 3A:
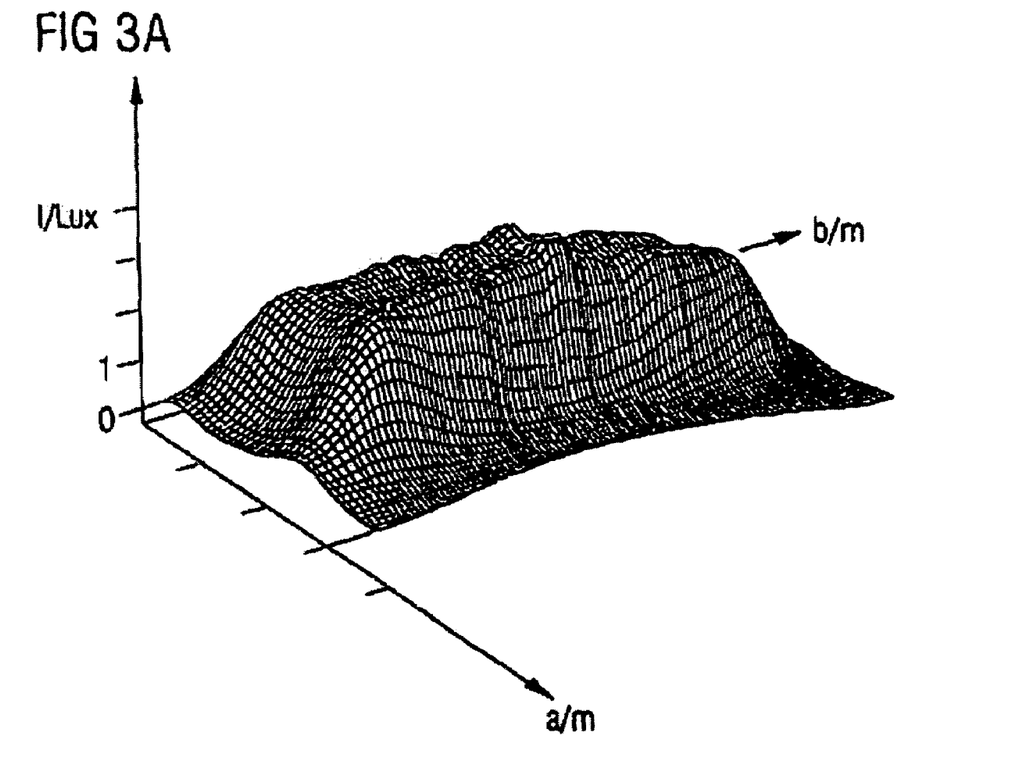
FIG. 3a shows the measured illuminance of an exemplary embodiment of the here-described LED arrangement.
Figure 3B:
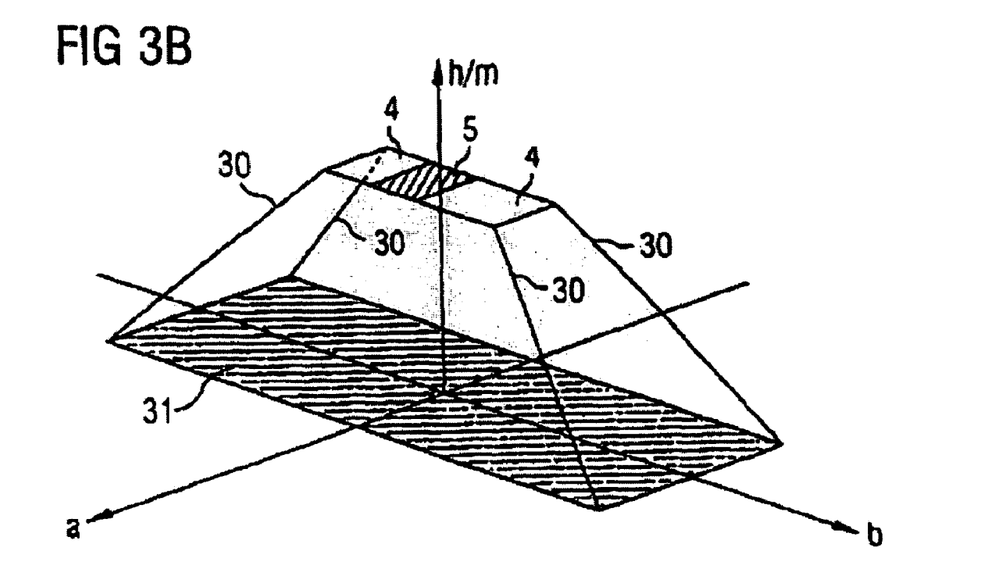
FIG. 3b schematically illustrates the arrangement of an exemplary embodiment of the here-described LED arrangement relative to the area to be illuminated.

The use of the described optics results in the measured illuminance 1 shown in FIG. 3a. FIG. 3a shows the measured illuminance I in lux in defined area 31 for an arrangement of the optics as illustrated in FIG. 3b (where the edges 30 nominally denote the outer boundaries of the light rays passing through the optical element). In this example, the LED 20 is disposed at a height of h=2.5 m above defined area 31 and is located at the geometrical center of the light entrance surface 1 at the coordinates x=0, y=0, z=0. The LED 20 is modeled as a light source with Lambertian radiation characteristics. The decoupling surface 21 of the LED 20 has a diameter of 2.5 mm.

In FIG. 3a, area 31, here measuring 2 m by 8 m, is shown to be illuminated substantially uniformly. The illuminance I in this case is at least 1 lx over the entire area 31. At the edges of area 31, illuminance 1 drops off abruptly. Illuminance 1 has steeply sloping flanks at those locations. The illuminated area in this case is geometrically similar to the plan view of radiation exit surface 6.

Figure 5A:
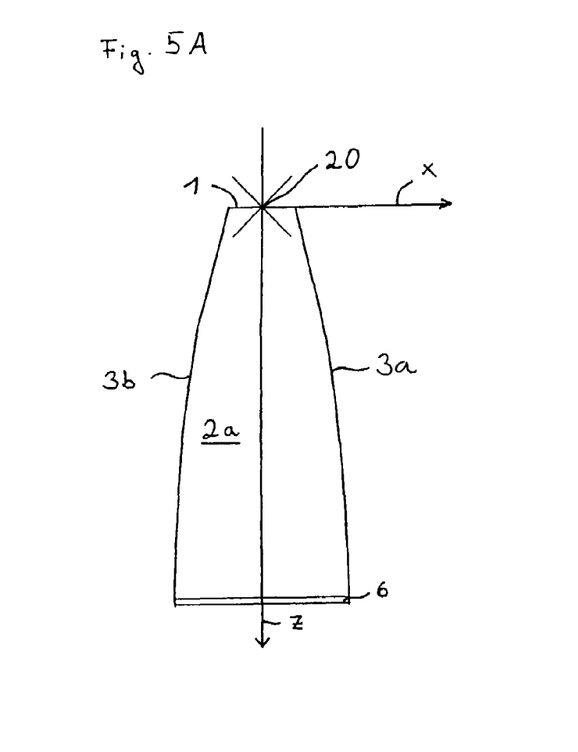

FIG. 5A shows a cross-sectional view of the optical element at the reflective surface 2a. Table 1 shown below gives x-coordinates and z-coordinates of points at the side face 3a of the optical element as shown in FIG. 5A. All values are given in millimeters. The optical element is axially symmetric with respect to the z-axis.

Figure 5B:
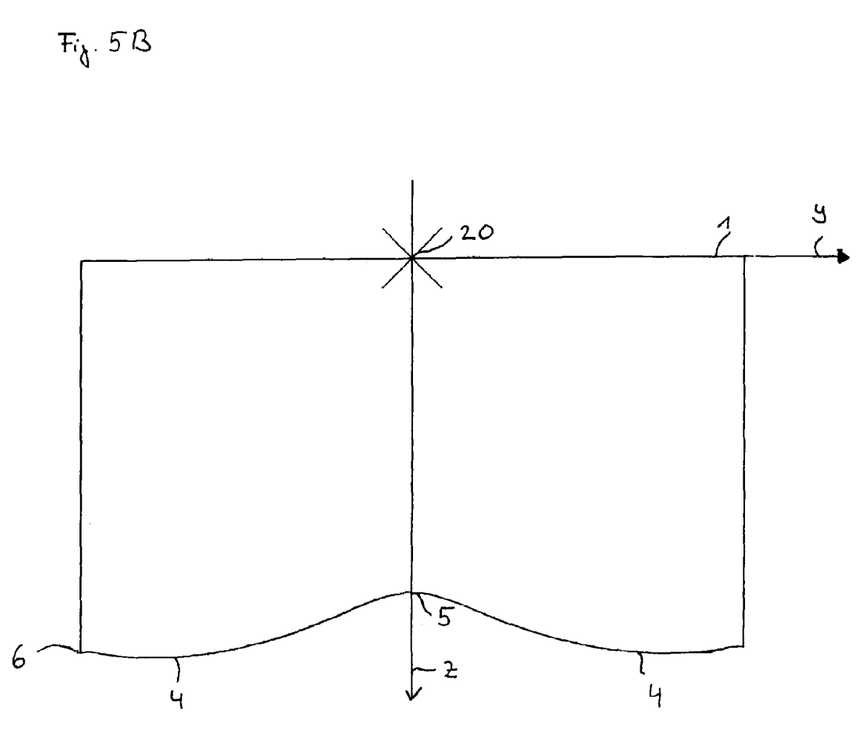
FIG. 5B shows a cross-sectional view of the optical element along the radiation entrance surface 1.

FIG. 5B shows a cross-sectional view of the optical element along the radiation entrance surface 1. FIG. 5B shows a cross-sectional view with the y-axis running along the light entrance surface 1 through the geometrical center of the light entrance surface at the coordinates x=0, y=0, z=0. The optical element is axially symmetrical with respect to the z-axis. Table 2 shown below gives y-coordinates and z-coordinates of points at the light exit surface 6.

TABLE 1

| x [mm] | z [mm] |
|---|---|
| 2.000 | 0.000 |
| 3.370 | −5.650 |
| 3.410 | −5.820 |
| 3.510 | −6.260 |
| 3.680 | −7.030 |
| 3.900 | −8.220 |
| 4.180 | −9.980 |
| 4.510 | −12.610 |
| 4.850 | −16.620 |
| 5.160 | −23.080 |

TABLE 2

| y [mm] | z [mm] |
|---|---|
| 0.000 | −20.270 |
| 0.140 | −20.270 |
| 0.270 | −20.270 |
| 0.410 | −20.280 |
| 0.540 | −20.290 |
| 0.680 | −20.300 |
| 0.810 | −20.320 |
| 0.950 | −20.340 |
| 1.080 | −20.370 |
| 1.220 | −20.400 |
| 1.350 | −20.430 |
| 1.350 | −20.430 |
| 1.710 | −20.530 |
| 2.080 | −20.650 |
| 2.450 | −20.770 |
| 2.820 | −20.920 |
| 3.200 | −21.070 |
| 3.590 | −21.230 |
| 3.990 | −21.390 |
| 4.400 | −21.560 |
| 4.810 | −21.720 |
| 5.230 | −21.880 |
| 5.660 | −22.050 |
| 6.100 | −22.210 |
| 6.550 | −22.370 |
| 7.010 | −22.520 |
| 7.470 | −22.670 |
| 7.940 | −22.810 |
| 8.420 | −22.950 |
| 8.910 | −23.080 |
| 9.410 | −23.200 |
| 9.910 | −23.320 |
| 10.430 | −23.430 |
| 10.950 | −23.530 |
| 11.470 | −23.620 |
| 12.000 | −23.700 |
| 12.540 | −23.770 |
| 13.090 | −23.820 |
| 13.640 | −23.870 |
| 14.190 | −23.900 |
| 14.750 | −23.920 |
| 15.320 | −23.930 |
| 15.890 | −23.930 |
| 16.460 | −23.910 |
| 17.040 | −23.880 |
| 17.610 | −23.830 |
| 18.190 | −23.760 |
| 18.770 | −23.680 |
| 19.350 | −23.580 |
| 20.000 | −23.580 |

In contrast to the arrangement of the LED 20 shown in FIGS. 5A and 5B the LED 20 can also be arranged with a gap 23 between the radiation entrance surface 1 and the radiation exit surface 21. In this connection a gap 23 with at most 500 μm gap-length proves to be very advantageous. Due to the e.g.

air-filled gap 23 light from the LED 20 is refracted at the light entrance surface 1 yielding further focussing of the light beam.

Figure 4A:
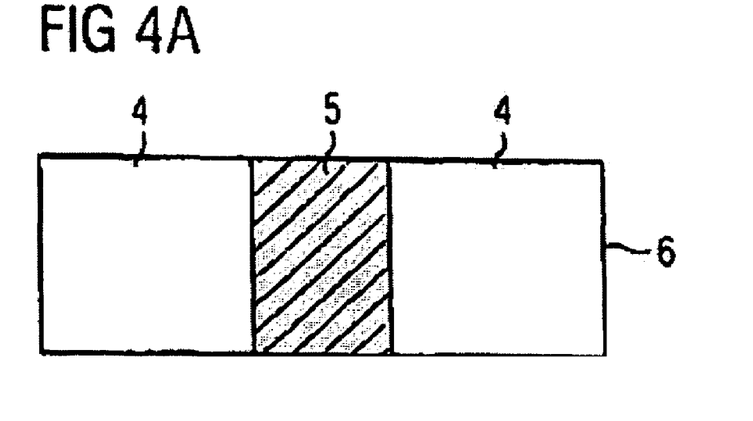
FIG. 4a is a schematic plan view of the radiation decoupling surface of a first exemplary embodiment of the here-described optical element.
Figure 4B:
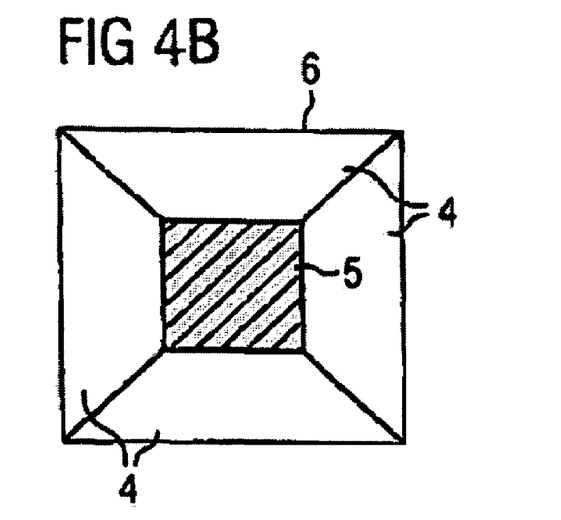
FIG. 4b is a schematic plan view of the radiation decoupling surface of a second exemplary embodiment of the here-described optical element.
Figure 4C:
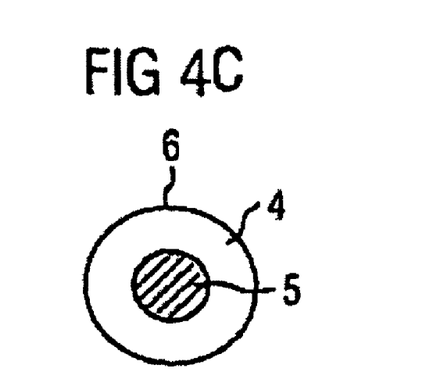
FIG. 4c is a schematic plan view of the radiation decoupling surface of a third exemplary embodiment of a here-described optical element.

FIGS. 4a, 4b and 4c show different exemplary embodiments of the radiation exit surface 6 of the optical element. The radiation exit surface 6 of the optical element can be adapted to the size and shape of the area to be illuminated. To this end, concavely curved region 5 can be surrounded by one (cf. FIG. 4c) or more (cf. FIGS. 4a, b) convexly curved subregions.

Figure 6:
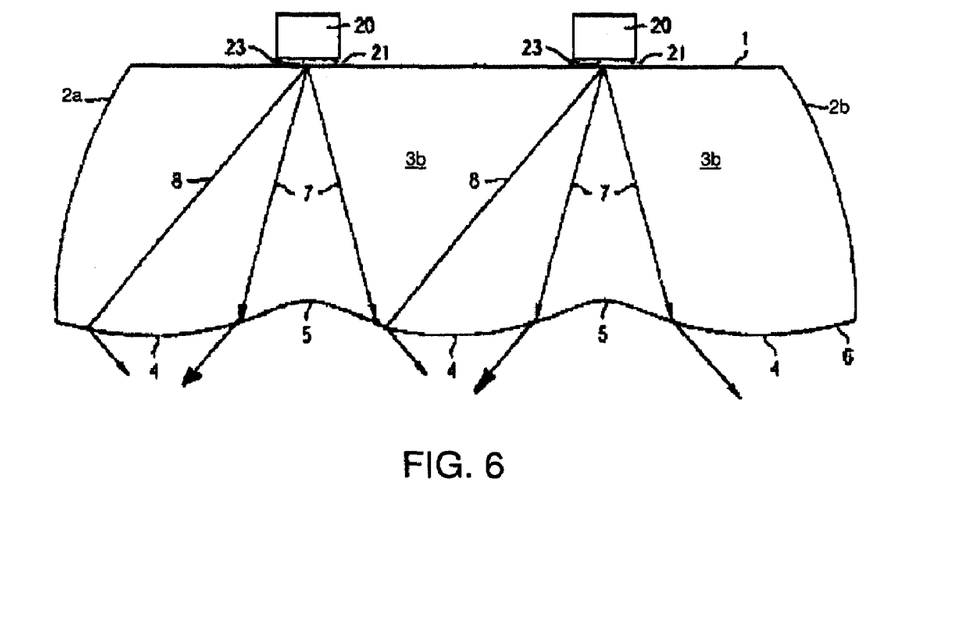
FIG. 6 is a schematic diagram of an embodiment of an optical element with a plurality of concavely curved subregions and a plurality of LEDs.

It is further possible for the radiation exit surface to comprise plural concavely curved subregions. In that case, one LED 20 is advantageously disposed at radiation entrance surface 1 opposite each concavely curved subregion 5. The LED 20 is preferably arranged so that it is centered with respect to the concavely curved region 5. An embodiment of an optical element with a plurality of concavely curved subregions is shown in FIG. 6.

Figure 7:
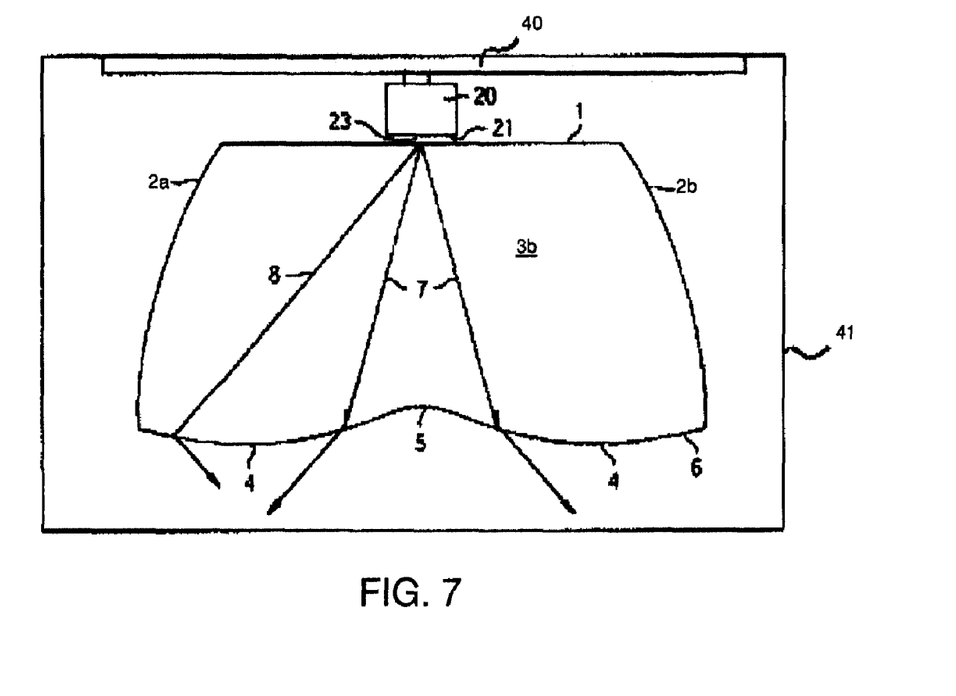
FIG. 7 is a schematic diagram of an embodiment of an emergency lighting system.

Emergency lighting systems can generally include one of the above-described LED arrangements and a network-independent power supply. FIG. 7 shows an embodiment of an emergency lighting system 41 that includes a network-independent power supply 40. The network-independent power supply can be, for example, commercial rechargeable batteries, disposed along with the LED arrangement in a housing. In some embodiments, the LED arrangement can be connected via the in-house power supply system and can be powered via emergency power generating sets in the event of a power failure.

This patent application claims the priorities of German Patent Applications 102004035127.9 and 102004042561.2, whose disclosure content is hereby incorporated by reference.

The invention is not limited by the description based on the exemplary embodiments. Rather, the invention encompasses any novel feature and any combination of features, including in particular any combination of features recited in the claims, even if said feature or said combination of features itself is not explicitly mentioned in the claims or the exemplary embodiments. For example, following the general principles disclosed herein additional designs for the surfaces of the optical element can be generated using commercially available ray-tracing programs.

Accordingly, additional embodiments are within the scope of the following claims.

What is claims is:

1. An optical element, comprising a body having a radiation entrance surface, a radiation exit surface, a plurality of side faces disposed between the radiation entrance surface and the radiation exit surface, and an optical axis, wherein:
   the optical element is not cylindrically symmetric about the optical axis;
   the radiation exit surface comprises at least one concavely curved subregion and at least one convexly curved subregion; and
   at least two side faces of the plurality of side faces are shaped to form one or more of a compound parabolic concentrator, a compound elliptic concentrator, and a compound hyperbolic concentrator.

2. The optical element as claimed in claim 1, wherein the optical element is configured to substantially uniformly illuminate a planar region oriented perpendicular to the optical axis by directing light from a light source to be incident on the planar region, and wherein a maximum illuminance in the planar region is no more than 10% greater than a minimum illuminance in the planar region.

3. The optical element as claimed in claim 1, wherein the radiation exit surface comprises at least one concavely curved subregion disposed in the center of the radiation exit surface.

4. The optical element as claimed in claim 1, wherein the radiation exit surface comprises at least one concavely curved subregion disposed adjacent to at least one convexly curved subregion.

5. The optical element as claimed in claim 1, wherein the shape of the periphery of the radiation exit surface matches the shape of the defined area to be illuminated.

6. The optical element as claimed in claim 1, further comprising at least one reflective surface disposed between the radiation entrance surface and the radiation exit surface.

7. The optical element as claimed in claim 1, comprising at least one side radiation exit surface disposed between the radiation entrance surface and the radiation exit surface.

8. The optical element as claimed in claim 1, wherein the body comprises a material that has a refractive index of at least n=1.3.

9. The optical element as claimed in claim 1, wherein the body comprises glass, polycarbonate, poly(monomethyl itconate), polymethylmethacrylate, or cyclo olefin copolymer.

10. A LED arrangement, comprising at least one optical element as claimed in claim 1 and at least one LED as a source of the light.

11. The LED arrangement as claimed in claim 10, wherein the radiation entrance surface is disposed after the LED in a main radiation direction and the LED is disposed opposite a concavely curved subregion of the radiation exit surface.

12. The LED arrangement as claimed in claim 10, wherein the LED comprises at least one LED chip of thin-film construction.

13. The LED arrangement as claimed in claim 10, wherein the LED has a power consumption of between 1 W and 2 W.

14. The LED arrangement as claimed in claim 10, wherein the LED arrangement is suitable for illuminating the defined surface area over at least 16 m$^2$ with an average illuminance of at least 1 lx.

15. The LED arrangement as claimed in claim 10, wherein a gap is disposed between the radiation entrance surface of the optical element and a radiation decoupling surface of the LED.

16. The LED arrangement as claimed in claim 10, further comprising a plurality of LEDs, and wherein the radiation exit surface comprises a plurality of concavely curved subregions and each LED is arranged so as to be centered with respect to a corresponding one of the concavely curved subregions of the radiation exit surface.

17. Emergency lighting, comprising the LED arrangement as claimed in 10 and a network-independent power supply.

18. The optical element as claimed in claim 1, wherein light is provided to the optical element by a divergent light source at or near the radiation entrance surface.

19. The optical element as claimed in claim 1, wherein the optical element is configured to substantially uniformly illuminate a planar region oriented perpendicular to the optical axis by directing light from a light source to be incident on the planar region, and wherein a maximum illuminance in the planar region is no more than 25% greater than a minimum illuminance in the planar region.

* * * * *

UNITED STATES PATENT AND TRADEMARK OFFICE
CERTIFICATE OF CORRECTION

PATENT NO.       : 7,465,074 B2
APPLICATION NO.  : 11/181388
DATED            : December 16, 2008
INVENTOR(S)      : Simon Blümel

Page 1 of 1

It is certified that error appears in the above-identified patent and that said Letters Patent is hereby corrected as shown below:

Column 10
Claim 9, Line 24, replace "itconate)," with --itaconate),--
Claim 17, Line 53, replace "10" with --claim 10--

Signed and Sealed this

Eighteenth Day of May, 2010

David J. Kappos
*Director of the United States Patent and Trademark Office*